(12) United States Patent
Tsai

(10) Patent No.: US 7,123,484 B2
(45) Date of Patent: Oct. 17, 2006

(54) MULTI-LAYER AND MULTI-DIRECTION FAN DEVICE

(75) Inventor: Mong-Hau Tsai, Taipei (TW)

(73) Assignee: Quanta Computer, Inc., Tao Yuan Shien (TW)

(*) Notice: Subject to any disclaimer, the term of this patent is extended or adjusted under 35 U.S.C. 154(b) by 78 days.

(21) Appl. No.: 10/843,416

(22) Filed: May 12, 2004

(65) Prior Publication Data

US 2005/0168953 A1  Aug. 4, 2005

(30) Foreign Application Priority Data

Feb. 4, 2004   (TW) ............................. 93102550 A

(51) Int. Cl.
  *H05K 7/20* (2006.01)
  *H05K 5/00* (2006.01)
  *A47F 3/04* (2006.01)
  *F28F 7/00* (2006.01)
  *F24H 3/02* (2006.01)
  *H01L 23/34* (2006.01)
  *H01B 7/42* (2006.01)
  *H02G 3/03* (2006.01)
  *F04D 29/40* (2006.01)
  *F01D 25/24* (2006.01)
  *F01D 25/26* (2006.01)

(52) U.S. Cl. ............... 361/719; 361/692; 361/695; 454/184; 312/236; 165/80.3; 165/185; 165/121; 257/712; 257/713; 257/721; 174/16.1; 174/15.1; 174/252; 415/126; 415/127; 415/213.1

(58) Field of Classification Search .............. 361/719, 361/695; 257/213.1, 721, 175–177; 415/126–127
See application file for complete search history.

(56) References Cited

U.S. PATENT DOCUMENTS

| | | | | |
|---|---|---|---|---|
| 4,949,780 | A * | 8/1990 | Chen | 165/7 |
| 5,732,786 | A * | 3/1998 | Fujigaki | 180/19.3 |
| 5,954,124 | A * | 9/1999 | Moribe et al. | 165/104.34 |
| 6,252,770 | B1 * | 6/2001 | Yu et al. | 361/695 |
| 6,315,655 | B1 * | 11/2001 | McEwan et al. | 454/184 |
| 6,400,563 | B1 * | 6/2002 | Mohi et al. | 361/683 |
| 6,452,797 | B1 * | 9/2002 | Konstad | 361/695 |
| 6,519,149 | B1 * | 2/2003 | Inoue | 361/689 |
| 2002/0071250 | A1 * | 6/2002 | Shih | 361/695 |
| 2004/0100769 | A1 * | 5/2004 | Chung et al. | 361/697 |

FOREIGN PATENT DOCUMENTS

TW  532750  5/2003
TW  555068  9/2003

* cited by examiner

*Primary Examiner*—Lisa Lea-Edmonds
*Assistant Examiner*—Zachary Pape
(74) *Attorney, Agent, or Firm*—Rabin & Berdo, PC

(57) ABSTRACT

A multi-layer and multi-direction radial fan device is disclosed, comprising an upper cover, a tower fan body, a cavity partition and a lower cover. The tower fan body is located in the upper cover, and the tower fan body comprises a first fan layer and a second fan layer. The cavity partition is located under the upper cover, wherein the cavity partition comprises an opening, and the tower fan body extends through the opening so as to make the first fan layer between the upper cover and the cavity partition. The lower cover is located under the cavity partition, wherein the lower cover comprises an opening to expose the bottom surface of the second fan layer, and the second fan layer is located between the cavity partition and the lower cover.

18 Claims, 4 Drawing Sheets

MULTI-LAYER AND MULTI-DIRECTION FAN DEVICE

FIELD OF THE INVENTION

The present invention relates to a multi-layer and multi-direction radial fan device, and more particularly, to a multi-layer and multi-direction radial tower fan device.

BACKGROUND OF THE INVENTION

With the rapid development of information technology and highly popularized applications of computers, portable and miniature electronic instruments have been extensively used in daily life. In pursuit of facility and practicality, the tendency of current portable electronic products is toward light, thin, small-footprint designs to meet market expectations. For example, a notebook computer is portable and highly capable of processing large quantities of digital data; thus, the notebook computer is popular and used widely.

With the great advancement of integrated circuit processes and the increasingly rising demand for higher integrated circuit capacities, the designs of current integrated circuits are very delicate and complex. Both users and software applications place great demands on central processing units (CPU), thereby necessitating powerful but complex circuit layouts. Although these central processing units provide many powerful functions, the complicated circuit design causes a great consumption of electrical energy. This energy consumption results in raising the chip temperature, and in turn degrades performance and may cause permanent chip damage. This problem is especially serious in portable electronic devices.

In general, rapid heat dissipation is very important for electronic devices, especially for computers, to achieve optimum efficiency. When heat cannot be dissipated instantly but instead accumulates within an electronic device, the device cannot function properly; and if, for example a CPU does not function properly, the whole computer is accordingly degraded and may even become irreparably damaged.

Fans are used extensively in many electronic products to dissipate heat such that the products function optimally and are protected from permanent damage. When the temperature of a system is excessive, a fan speeds up to lower the temperature of the whole system; when the temperature of the system has been lowered to a set value, the fan speed then returns to the original rate. Typically, a fan module in an electronic product is connected with an outer environment, so as to dissipate heat to the outer environment.

SUMMARY OF THE INVENTION

One objective of the present invention is to provide a multi-layer and multi-direction fan device comprising an upper cover, a cavity partition (or circuit board) and a lower cover to separate and control the wind directions of the multi-layer fans. Therefore, the multi-layer and multi-direction fan device not only can provide heat dissipating for a central processing unit but also can provide heat dissipating for systems located underneath a printed circuit board (PCB), the back of a central processing unit and chip sets, and thus lower the temperature of the whole system and effectively prolong the life of the system.

Another objective of the present invention is to provide a multi-layer and multi-direction fan device that includes a tower fan body such that the tower fan body relative to the largest fan diameter and the largest fan height can be fit within the limited space of a printed circuit board. A single fan device can be used to dissipate heat from a central processing unit and chip sets simultaneously within the limited space so that the layout of the system is more flexible.

According to the aforementioned objectives, the present invention further provides a multi-layer and multi-direction fan device located in an opening of a printed circuit board, and the multi-layer and multi-direction fan device comprising: an upper cover; a cavity partition located between the upper cover and the printed circuit board—or the printed circuit board itself can be used as the cavity partition—wherein a first cavity is formed by the cavity partition and the upper cover, and the cavity partition comprises an opening; a lower cover located under the printed circuit board, wherein a second cavity is formed by the lower cover and the printed circuit board or the cavity partition; and a tower fan body extending through the opening of the cavity partition, wherein the tower fan body comprises a first fan layer and a second fan layer, the first fan layer located within the first cavity and the second fan layer located within the second cavity.

According to a preferred embodiment of the present invention, the wind outlet direction of the first fan layer is different from that of the second fan layer, and the fan diameter of the first fan layer is different from that of the second fan layer. However, in another preferred embodiment of the present invention, the fan diameter of the first fan layer is the same as that of the second fan layer and is in accord with the size of the opening in the printed circuit board.

The multi-layer and multi-direction fan device of the present invention comprises a tower fan body and uses an upper cover, a cavity partition and a lower cover to exhaust wind on multiple layers and in multiple directions to provide diversified heat dissipation for prolonging the life of the system. Since a single fan device can be used to exhaust wind in multiple directions within the limited space, the layout of the system can be more flexible.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a multi-layer and multi-direction fan device. The multi-layer and multi-direction fan device includes a tower radial fan such that the multi-layer and multi-direction fan device can provide sufficient heat dissipation to lower the temperature of the whole system and thereby prolong the life of the system. In order to illustrates the present invention clearly, the following description is stated with reference to FIGS. 1–8b.

Figure 1:
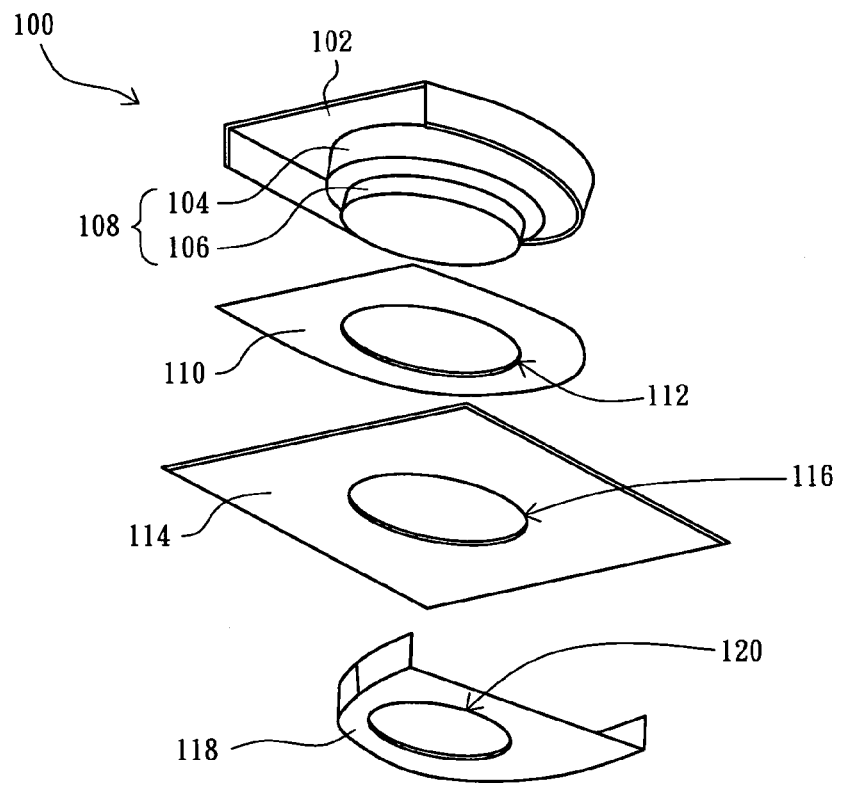
FIG. 1 illustrates a schematic diagram showing the assembling of a multi-layer and multi-direction fan device in accordance with a preferred embodiment of the present invention.
Figure 2:
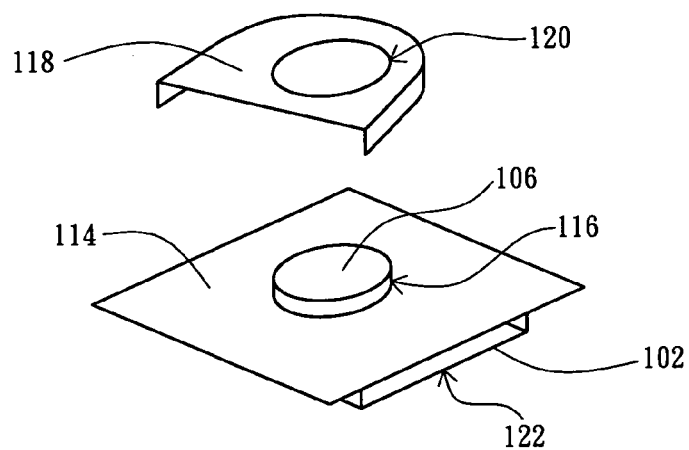
FIG. 2 illustrates a schematic diagram showing the assembling of a lower cover of a multi-layer and multi-direction fan device in accordance with a preferred embodiment of the present invention.
Figure 4:
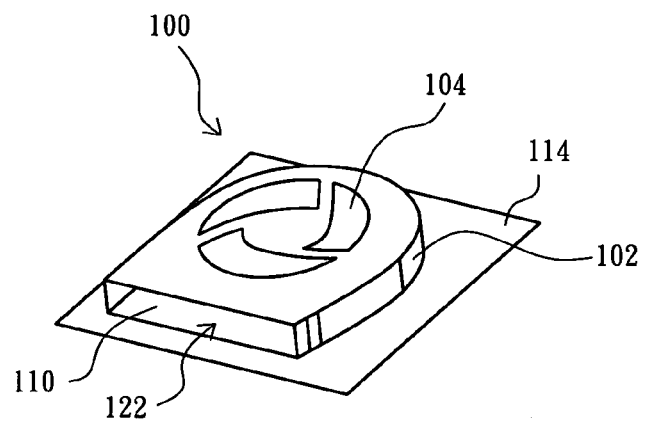
FIG. 4 illustrates a three-dimensional diagram showing a portion of an upper cover of a multi-layer and multi-direction fan device in accordance with a preferred embodiment of the present invention.

Referring to FIG. 1 and FIG. 2, FIG. 1 illustrates a schematic diagram showing the assembling of a multi-layer and multi-direction fan device in accordance with a preferred embodiment of the present invention, and FIG. 2 illustrates a schematic diagram showing the assembling of a lower cover of a multi-layer and multi-direction fan device in accordance with FIG. 1. The multi-layer and multi-direction fan device 100 can be installed in a printed circuit board 114 of a computer system, for example. The multi-layer and multi-direction fan device 100 comprises an upper cover 102, a tower fan body 108, a cavity partition 110 and a lower cover 118. The tower fan body 108 comprises a first fan layer 104 and a second fan layer 106 in stack, wherein the first fan layer 104 and the upper cover 102 can be integrated into one structure, and the size of an upper cover intake 103 (as shown in FIG. 4) depends on the drafting capacity of the first fan layer 104. The fan diameter of the second fan layer 106 depends on the size of an opening 116 in the printed circuit board 114. Thus, the fan diameter of the first fan layer 104 can be the same as or different from that of the second fan layer 106, and whether the first fan layer 104 and the second fan layer 106 have the same fan diameter as each other will be affected by the size of the opening 116 in the printed circuit board 114. The fan heights of the first fan layer 104 and the second fan layer 106 can be adjusted according to the spaces where the multi-layer and multi-direction fan device 100 is located and the location of the cavity partition 110, so that the fan heights of the first fan layer 104 and the second fan layer 106 within the limited space is maximized. The cavity partition 110 comprises a partition opening 112, wherein the size of the partition opening 112 is slightly larger than that of the second fan layer 106, thereby enabling the second fan layer 106 to be inserted through the partition opening 112 of the cavity partition 110. The lower cover 118 comprises a lower cover intake 120, wherein the size of the lower cover intake 120 is preferably slightly larger than that of the second fan layer 106, so that the bottom of the second fan layer 106 can be inserted through the lower cover intake 120, and the bottom of the second fan layer 106 can be deposed into the lower cover intake 120.

When the multi-layer and multi-direction fan device 100 is assembled, the second fan layer 106 of the tower fan body 108 passes through the partition opening 112 of the cavity partition 110 and the opening 116 of the printed circuit board 114 in sequence, and the cavity partition 110 covers the bottom of the upper cover 102. A cavity is thus formed by the upper cover 102 and the cavity partition 110; and this cavity holds the first fan layer 104 of the tower fan body 108. The cavity partition 110 covers a surface of the printed circuit board 114. The lower cover 118 covers the other surface of the printed circuit board 114 so that another cavity is formed between the lower cover 118 and the printed circuit board 114; the second fan layer 106 is held within this cavity, as illustrated in FIG. 1 and FIG. 2.

Figure 3:
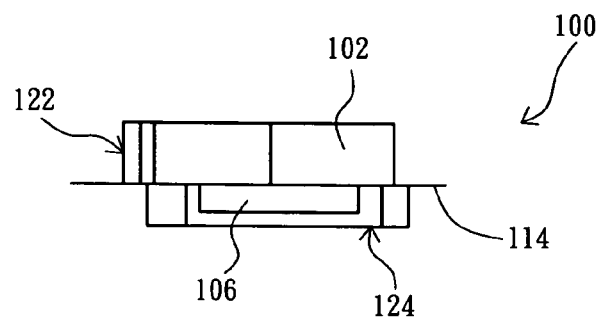
FIG. 3 illustrates a lateral view of a multi-layer and multi-direction fan device in accordance with a preferred embodiment of the present invention.

Referring to FIG. 3, a lateral view is shown of a multi-layer and multi-direction fan device in accordance with a preferred embodiment of FIG. 1. In the completely assembled multi-layer and multi-direction fan device 100, the cavity partition 110 is located between the upper cover 102 and the lower cover 118, and the printed circuit board 114 is preferably next to the cavity partition 110 and between the cavity partition 110 and the lower cover 118.

Figure 5:
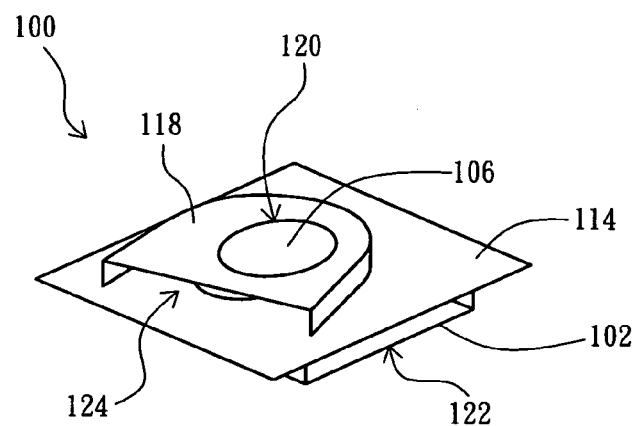
FIG. 5 illustrates a three-dimensional diagram showing a portion of a lower cover of a multi-layer and multi-direction fan device in accordance with a preferred embodiment of the present invention.

Referring to FIG. 4 and FIG. 5, FIG. 4 illustrates a three-dimensional diagram showing a portion of an upper cover of a multi-layer and multi-direction fan device in accordance with a preferred embodiment of the present invention, and FIG. 5 illustrates a three-dimensional diagram showing a portion of a lower cover of a multi-layer and multi-direction fan device in accordance with a preferred embodiment of the present invention. The first fan layer 104 of the tower fan body 108 is located between the upper cover 102 and the cavity partition 110, and the second fan layer 106 of the tower fan body 108 is located between the printed circuit board 114 and the lower cover 118. The assembly of the upper cover 102 and the cavity partition 110 forms an upper cover wind outlet 122, and the printed circuit board 114 and the lower cover 118 forms an lower cover wind outlet 124.

Figure 6:
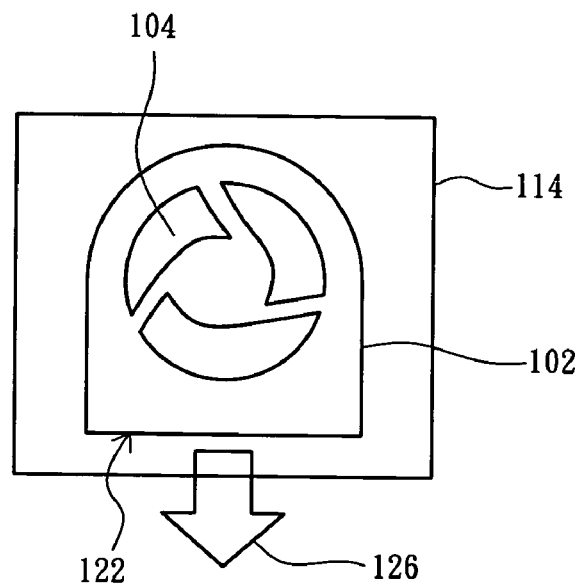
FIG. 6 illustrates a top view of a multi-layer and multi-direction fan device in accordance with a preferred embodiment of the present invention.
Figure 7:
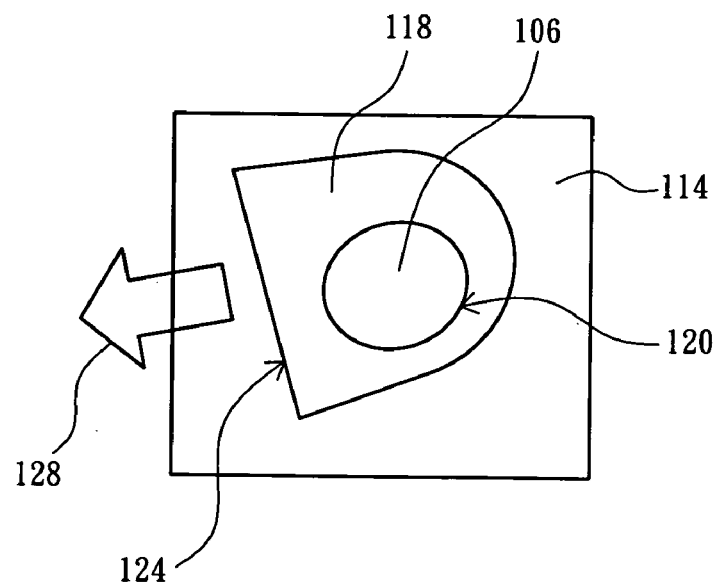
FIG. 7 illustrates a bottom view of a multi-layer and multi-direction fan device in accordance with a preferred embodiment of the present invention.

Referring to FIG. 6 and FIG. 7, FIG. 6 illustrates a top view of a multi-layer and multi-direction fan device in accordance with a preferred embodiment of the present invention, and FIG. 7 illustrates a bottom view of a multi-layer and multi-direction fan device in accordance with a preferred embodiment of the present invention. When the multi-layer and multi-direction fan device 100 is assembled, the direction of the upper cover wind outlet 122 and the direction of the lower cover wind outlet 124 can be adjusted to make a first wind outlet direction 126 of the first fan layer 104 different from a second wind outlet direction 128 of the first fan layer 106. Therefore, the tower fan body 108 can force air in different directions above and below the printed circuit board 114, so as to cool different components in the system. However, it is worthy to note that the upper cover wind outlet 122 of the first fan layer 104 and the lower cover wind outlet 124 of the second fan layer 106 in the tower fan body 108 can be aligned so as to force air in the same direction.

One feature of the present invention is that the multi-layer and multi-direction fan device 100 of the present invention consists of a tower radial fan body composed of at least two fan layers; and the upper cover 102, the cavity partition 110 and the lower cover 118 are used to channel air on multiple layers and in multiple directions. Therefore, a single fan device can be used to force wind in multiple directions within limited space, so as to provide diversified heat dissipation.

Figure 8A:
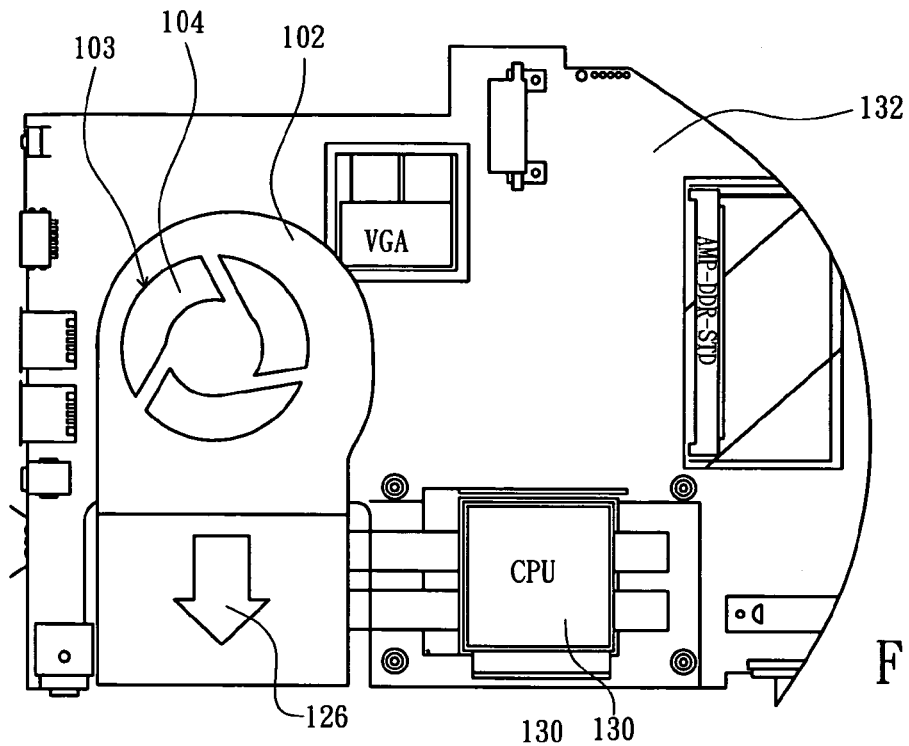
FIG. 8a illustrates a top view of a multi-layer and multi-direction fan device installed in a printed circuit board in accordance with a preferred embodiment of the present invention.
Figure 8B:
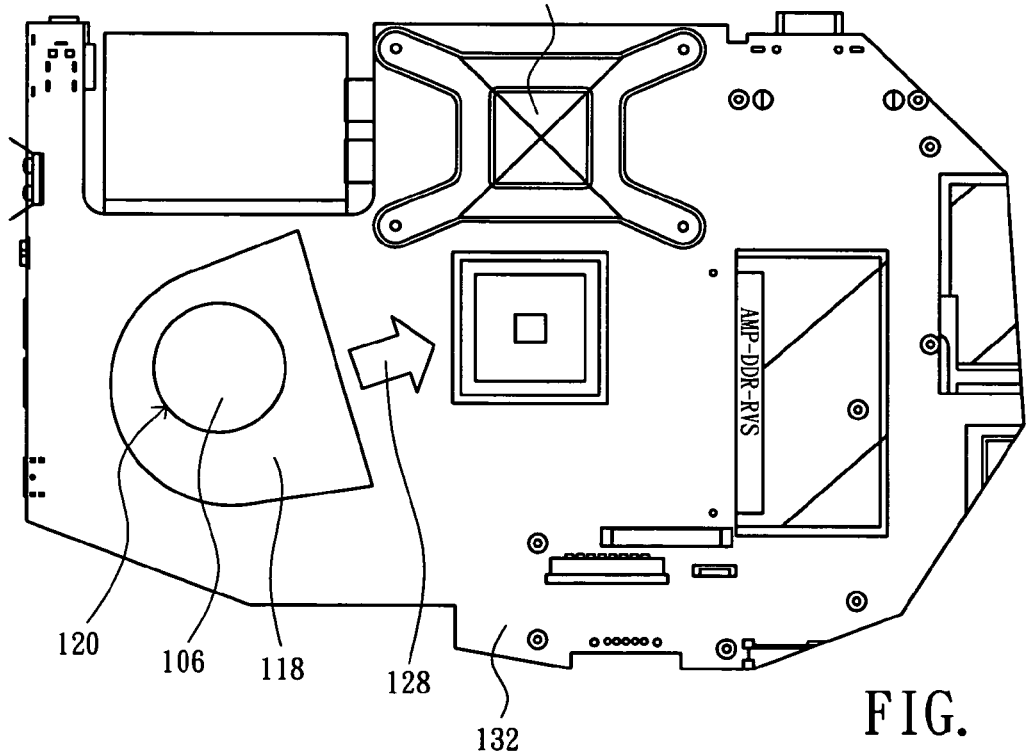
FIG. 8b illustrates a bottom view of a multi-layer and multi-direction fan device installed in a printed circuit board in accordance with a preferred embodiment of the present invention.

According to the aforementioned description, one advantage of the present invention is that the present invention uses the upper cover 102, the cavity partition 110 and the lower cover 118 to separate and control the wind outlet directions of the multi-layer fans. Therefore, the multi-layer and multi-direction fan device has diversified heat dissipation; it not only can dissipate heat from a central processing unit 130, but it also can dissipate heat from systems located underneath of a printed circuit board 132, the back of the central processing unit 130 and chip sets, as illustrated in FIG. 8a and FIG. 8b. Thus, the temperature of the whole system can be lowered, effectively prolonging the life of the system.

According to the aforementioned description, the other advantage of the present invention is that the multi-layer and multi-direction fan device of the present invention can provide a tower fan body of a larger fan diameter and a larger fan height within the limited space. Therefore, a single fan device can be used to dissipate heat from a central processing unit and chip sets simultaneously within the limited space, so that the system layout is made more flexible.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A multi-layer and multi-direction fan device suitable to exhaust wind on multiple layers to provide diversified heat dissipation, the multi-layer and multi-direction fan device, comprising:
    an upper cover;
    a cavity partition located under the upper cover, wherein the cavity partition comprises an opening, and a first cavity and a first wind outlet having a first wind outlet direction are formed by the upper cover and the cavity partition, the first wind outlet being the only wind outlet formed by the upper cover and the cavity partition;
    a lower cover located under the cavity partition, wherein a second cavity and a second wind outlet having a second wind outlet direction are formed by the lower cover and the cavity partition, the second wind outlet being the only wind outlet formed by the lower cover and the cavity partition; and
    a tower fan body extending through the opening of the cavity partition, wherein the tower fan body comprises a first fan layer and a second fan layer, the first fan layer is located within the first cavity, and the second fan layer is located within the second cavity.

2. The multi-layer and multi-direction fan device according to claim 1, wherein the first wind outlet direction of the first wind outlet is different from the second wind outlet direction of the second wind outlet.

3. The multi-layer and multi-direction fan device according to claim 1, wherein the first wind outlet direction of the first wind outlet is the same as the second wind outlet direction of the second wind outlet.

4. The multi-layer and multi-direction fan device according to claim 1, wherein the fan diameter of the first fan layer is the same as the fan diameter of the second fan layer.

5. The multi-layer and multi-direction fan device according to claim 1, wherein the fan diameter of the first fan layer is different from the fan diameter of the second fan layer.

6. The multi-layer and multi-direction fan device according to claim 1, wherein the tower fan body extends through an opening of a printed circuit board.

7. The multi-layer and multi-direction fan device according to claim 6, wherein the printed circuit board is the cavity partition.

8. The multi-layer and multi-direction fan device according to claim 7, wherein the second fan layer is located between the printed circuit board and the lower cover.

9. A multi-layer and multi-direction fan device, located in an opening of a printed circuit board and suitable to exhaust wind on multiple layers to provide diversified heat dissipation, the multi-layer and multi-direction fan device comprising:
    an upper cover;
    a cavity partition located between the upper cover and the printed circuit board, and next to the printed circuit board, wherein a first cavity is formed by the cavity partition and the upper cover, and the cavity partition comprises an opening;
    a lower cover located under the cavity partition, wherein a second cavity is formed by the lower cover and the printed circuit board; and
    a tower fan body extending through the opening of the cavity partition, wherein the tower fan body comprises a first fan layer and a second fan layer, the first fan layer is located within the first cavity, and the second fan layer is located within the second cavity, wherein the configuration of the upper cover, the cavity partition and the lower cover forms only two wind outlets respectively for the first fan layer and the second fan layer, and each wind outlet has a wind outlet direction.

10. The multi-layer and multi-direction fan device according to claim 9, wherein the wind outlet direction of the first fan layer is different from that of the second fan layer.

11. The multi-layer and multi-direction fan device according to claim 9, wherein the wind outlet direction of the first fan layer is the same as that of the second fan layer.

12. The multi-layer and multi-direction fan device according to claim 9, wherein the fan diameter of the first fan layer is the same as the fan diameter of the second fan layer.

13. The multi-layer and multi-direction fan device according to claim 9, wherein the fan diameter of the first fan layer is different from the fan diameter of the second fan layer.

14. The multi-layer and multi-direction fan device according to claim 9, wherein the first fan layer is located between the cavity partition and the upper cover.

15. The multi-layer and multi-direction fan device according to claim 9, wherein the second cavity is formed by the printed circuit board and the lower cover, and the second fan layer is located between the printed circuit board and the lower cover.

16. A multi-layer and multi-direction fan device, comprising:
    an upper cover;

a cavity partition located under the upper cover, wherein the cavity partition comprises an opening, and a first cavity and a first wind outlet are formed by the upper cover and the cavity partition, wherein the cavity partition is a printed circuit board;

a lower cover located under the cavity partition, wherein a second cavity and a second wind outlet are formed by the lower cover and the cavity partition, the wind outlet direction of the first wind outlet being the same as the wind outlet direction of the second wind outlet; and a tower fan body extending through the opening of the cavity partition, wherein the tower fan body comprises a first fan layer and a second fan layer, the first fan layer being located within the first cavity, and the second fan layer being located within the second cavity.

17. The multi-layer and multi-direction fan device according to claim 16, wherein the fan diameter of the first fan layer is the same as the fan diameter of the second fan layer.

18. The multi-layer and multi-direction fan device according to claim 16, wherein the second fan layer is located between the printed circuit board and the lower cover.

* * * * *